United States Patent [19]

Floyd et al.

[11] Patent Number: 4,672,330
[45] Date of Patent: Jun. 9, 1987

[54] PHASE-LOCK LOOP SYSTEMS

[75] Inventors: John T. Floyd, Hemel Hempstead; Christopher D. Huggett, St. Albans; Michael A. Jones, Stanmore; John R. G. Woods, Watford, all of England

[73] Assignee: The Marconi Company Limited, England

[21] Appl. No.: 492,335

[22] Filed: Jul. 23, 1974

[30] Foreign Application Priority Data

Jul. 24, 1973 [GB] United Kingdom ............... 35271/73

[51] Int. Cl.[4] .............................................. H03L 7/06
[52] U.S. Cl. ........................................ 331/4; 331/25; 331/DIG. 2; 342/103
[58] Field of Search ........................ 331/1 R, 4, 18, 23, 331/25, DIG. 2

[56] References Cited

U.S. PATENT DOCUMENTS

| 2,848,615 | 8/1958 | Rother et al. ........................... 331/4 |
| 3,487,311 | 12/1969 | Luhowy ............................. 331/4 X |
| 3,852,682 | 12/1974 | Dawe et al. ........................... 331/4 |

Primary Examiner—T. H. Tubbesing
Attorney, Agent, or Firm—Kirschstein, Kirschstein, Ottinger & Israel

[57] ABSTRACT

A phase-lock loop system with particular use in radar tracking systems is disclosed. From a number of input signals of varying frequencies such as a carrier frequency and several side band frequencies the system can lock into phase and frequency with the input which has the largest amplitude by sweeping across a predetermined range of frequencies and allowing the phase-lock loop to operate only when a predetermined amplitude is exceeded.

8 Claims, 3 Drawing Figures

PHASE-LOCK LOOP SYSTEMS

BACKGROUND OF THE INVENTION

1. Field of the Invention

The invention relates to phase-lock loop systems and more particularly to phase-lock loop systems comprising a controllable-frequency oscillator, a phase-comparison circuit for performing a comparison between the output of the oscillator and an incoming oscillatory signal, and means for automatically adjusting the frequency of the oscillator in response to the result of that comparison, in such a manner as to tend to lock the oscillator into a predetermined frequency and phase relationship with the incoming signal.

2. Description of Prior Art

It is known to use such a phase-lock loop for coherent reception and frequency tracking of a signal. For example, the loop may be used in a radio receiver for receiving and tracking a radio signal which undergoes a doppler shift as a result of relative motion between the receiver and the source of the radio signal. Such phase-lock loops find applications, for example, in spacecraft tracking systems and in missile guidance systems.

In operation of such a phase-lock loop, if frequency and phase lock is lost at any time (e.g. because of excessive noise in the system), causing the frequency of the oscillator to diverge substantially from the incoming signal frequency, the loop may not be able to regain lock. Some means must therefore be provided to enable the loop to "acquire" an incoming signal. This may be achieved by applying a bias to the loop such as to cause the oscillator to scan through a predetermined range of frequencies until it approaches the above-mentioned predetermined frequency relationship with the incoming signal, whereupon the phase-lock loop will operate to pull rapidly into frequency and phase lock with the incoming signal.

Such a signal acquisition means is suitable for use in cases where the incoming signal consists of only a single frequency component. However, it would be desirable to provide a signal acquisition means suitable for use where the incoming signal consists of a plurality of frequency components and where it is required to lock on to a specific one of those components. For example, the incoming signal may be pulsed, and therefore have a frequency spectrum comprising a main line and a plurality of side lines of lower intensity, spaced symmetrically about the main line, and in such a case it may be desired to lock on to the main line, and not to the side lines.

SUMMARY OF THE INVENTION

Briefly the present invention provides an improved phase-lock loop system for an input signal with components at several frequencies. The phase-lock loop includes a local oscillator and is allowed to momentarily lock on to any one of the frequencies of the input signal; but if the amplitude of the input signal is not of a sufficiently high value the frequency of the local oscillator is altered in a predetermined direction to break the locking and to cause the system to search for a further locking frequency. This process is continually repeated until a locking frequency is obtained in which the input amplitude is greater than a predetermined level. At this time the influence of the circuitry which breaks the locking is removed and the phase-lock loop is allowed to pull exactly in to lock with the input frequency in the normal manner.

BRIEF DESCRIPTION OF THE DRAWINGS

Two phase-lock loop systems in accordance with the invention will now be described, by way of example, with reference to the drawings accompanying the specification of which.

DESCRIPTION OF THE PREFERRED EMBODIMENTS

Figure 1:
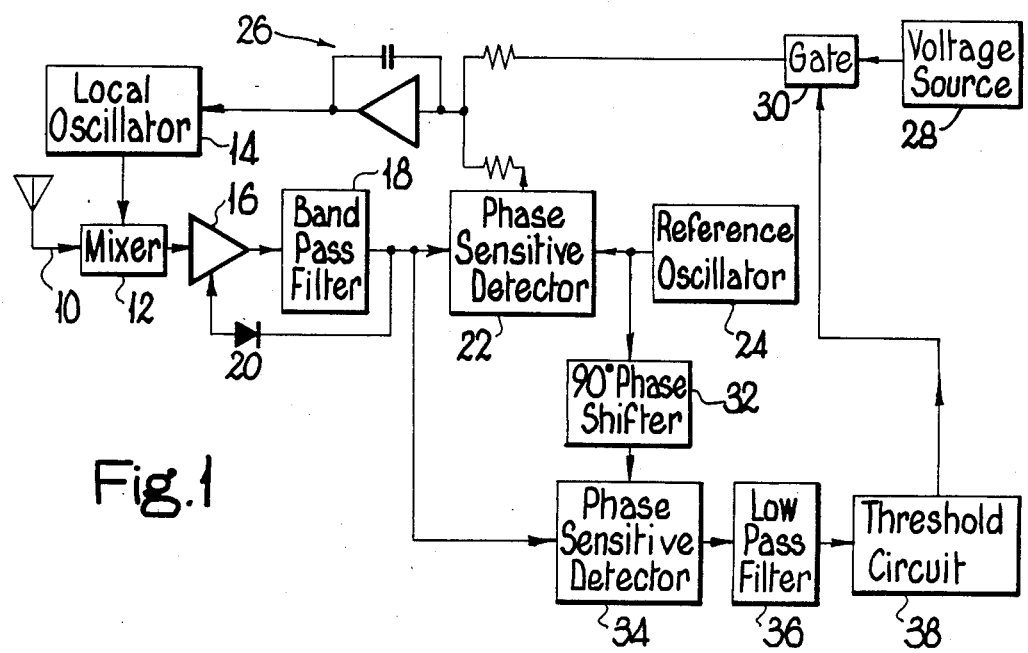
FIGS. 1 and 2 are schematic block circuit diagrams of the two respective systems.

Referring to FIG. 1, in the first system, an incoming radio signal is received by means of an aerial 10, and is combined in a mixer 12 with a signal from a radio-frequency local oscillator 14, to produce an intermediate frequency (I.F.) signal. If the incoming signal has a plurality of frequency components, the I.F. signal will also consist of a plurality of respective components. The I.F. signal is fed through an I.F. amplifier 16 and a band-pass filter 18. The signal from the filter 18 is detected by a diode 20, and fed back to the amplifier 16 in such a manner as to form an automatic-gain-control (A.G.C.) loop, which tends to maintain the total power appearing at the output of the filter 18 at a constant level. Thus, the output from the filter 18 is, in effect, a normalized version of the output from the mixer 12.

The output from the filter 18 is compared, in a phase-sensitive detector 22, with a reference signal generated by a reference oscillator 24, having a frequency lying approximately in the centre of the pass band of the filter 18. The output from the detector 22 is in turn applied to an integrator 26, the output of which is used to control the frequency of the local oscillator 14.

The components described so far form a phase-lock loop, which controls the frequency of the local oscillator 14 in such a manner as to tend to reduce any D.C. components in the output from the phase-sensitive detector 22 to a value such as to maintain the output of the integrator 26 at a constant value. The effect of this is to tend to lock the frequency of one of the I.F. signal components to the frequency of the reference signal. In other words, the loop tends to lock the local oscillator 14 into a predetermined frequency and phase relationship with one of the frequency components of the incoming signal from the aerial 10, such that the frequency difference between the component and the local oscillator frequency is equal to the reference oscillator frequency.

To enable the phase-lock loop to lock on to a predetermined one of the frequency components of the incoming signal, the system contains a signal acquisition circuit, which will now be described.

A D.C. bias signal is applied from a voltage source 28, by way of a gate 30, to the integrator 26. This bias signal causes the output of the integrator to vary linearly with time, and thereby causes the frequency of the local oscillator 14 to be swept through a predetermined range of values. This in turn causes the frequency components of the I.F. signal from the mixer 12 to be swept in frequency. Thus, if the I.F. frequency components initially lie outside the pass band of the I.F. filter 18, they will be swept into the pass band when the bias signal is applied. As the I.F. frequency components are swept through the pass band of the filter, the phase-lock loop will attempt to lock on to each one in turn as it approaches the frequency of the reference oscillator 24. However the bias signal is set at a value higher than the phase-lock loop can overcome, so that the loop does not remain in lock with any of the components, but continues to sweep in frequency.

The output of the reference oscillator is also fed to a 90° phase-shifter 32, so as to produce a quadrature reference signal. The I.F. signal from the filter 18 is compared with this quadrature reference signal in a second phase-sensitive detector 34, the output of which will thus contain beat frequencies between each component of the I.F. signal and the reference signal. This output is fed through a low-pass filter 36, which filters out the higher beat frequencies to leave only that corresponding to the I.F. component nearest in frequency to the reference signal.

As the local oscillator frequency is swept, the output from the low-pass filter 36 will consist of a series of pulses of low frequency beats, one pulse being produced for each I.F. component as it passes through the reference frequency. The amplitude of each pulse will be representative of the amplitude of the corresponding I.F. component. Thus, it will be seen that the output of the filter 36 represents a spectral analysis of the I.F. signal (and hence of the incoming R.F. signal). The spectrum so obtained is a normalized one, due to the A.G.C. loop at the I.F. amplifier 16.

The output from the filter 36 is fed to a threshold circuit 38, the threshold level of which is set so that only the largest amplitude component of the spectrum will trigger the threshold circuit 38. When triggered, the circuit 38 produces an inhibiting pulse which is applied to the gate 30 to inhibit that gate and thus remove the bias signal from the integrator 26. This permits the phase-lock loop to pull into phase and frequency lock with the I.F. component that is currently nearest in frequency to the reference frequency, i.e. the largest amplitude component.

It will be appreciated that the value at which the threshold level of the circuit 38 must be set in order to respond to the largest-amplitude component will depend on the nature of the spectrum of the incoming signal.

In a particular application of the phase-lock loop system shown in FIG. 1, the incoming R.F. signal consists of a pulsed R.F. carrier wave, with a pulse repetition frequency of, say, 10 KHz. Such a signal will have a frequency spectrum consisting of a main line at the carrier frequency, plus a number of sidebands, of lower amplitude, and spaced from the main line by multiples of the pulse repetition frequency. In such an application, it may be desired to have the loop "acquire" (i.e. lock on to) the main line, instead of a sideband. To achieve this, the threshold level of the circuit 38 is set at a value such that only the main line will trigger the circuit 38. This value will depend on the relative amplitudes of the main line and the sidebands which in turn depends on the duty ratio of the pulsed carrier. For example, if the duty ratio is 0.5, and the A.G.C. loop is set to normalize the output of the diode 20 at 1.0 volt, the main line will produce an output pulse of 0.7 volts at the low-pass filter 36, while the first sideband will produce an output pulse of 0.15 volts. Thus, if the threshold level is set at 0.5 volts, only the main line will trigger the threshold circuit, and cause the sweep to be inhibited.

Figure 2:
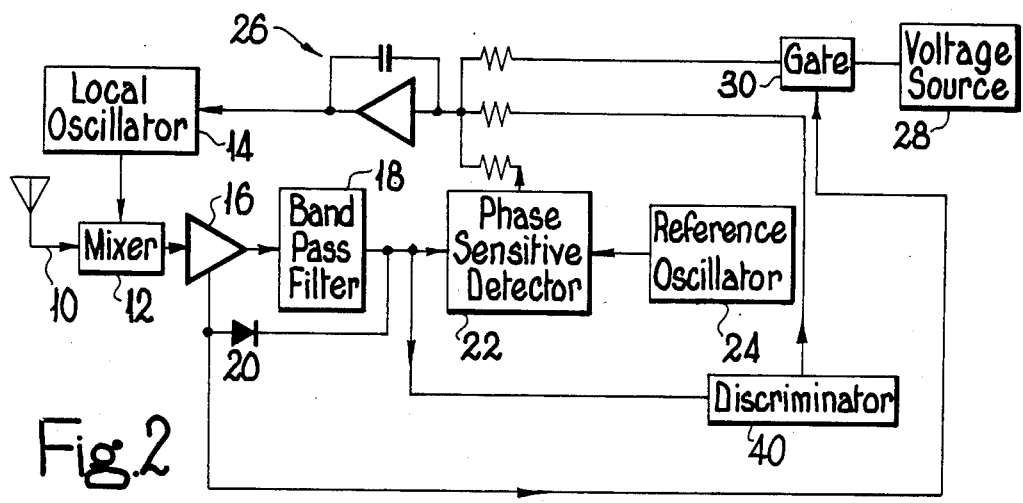

The signal acquisition circuit shown in FIG. 1 is not suitable for use with incoming pulsed signals having low duty ratios, e.g. having duty ratios less than 0.1, since in that case the amplitudes of the main line and the nearest sidebands become very close, and it becomes extremely difficult to distinguish between them on an amplitude basis. FIG. 2 shows a phase-lock loop system having an alternative acquisition circuit which is more suitable for such signals.

Referring to FIG. 2, the system shown therein includes a phase-lock loop basically the same as that of FIG. 1, and corresponding components of the two loops have therefore been denoted by the same numbers in these two Figues. Thus, the phase-lock loop in FIG. 2 comprises an aerial 10, a mixer 12, a local oscillator 14, an I.F. amplifier 16, an I.F. band-pass filter 18, an A.G.C. feedback diode 20, a phase-sensitive detector 22, a reference oscillator 24, and an integrator 26. However, the acquisition circuit in this case differs from that of FIG. 1.

As in the case of FIG. 1, the oscillator 14 is swept in frequency by means of a bias signal applied to the integrator 26 from a voltage source 28 by way of a gate 30. In this way, if the I.F. signal initially lies outside the pass band of the I.F. filter 18, it will be swept into the pass band. In this case, however, in contrast to FIG. 1, the gate 30 is controlled by the A.G.C. signal from the diode 20, in such a manner that, when a major portion of the I.F. signal has entered the pass band of filter 18, the A.G.C. signal rises to a sufficient level to inhibit the gate 30, and thus remove the bias signal from the integrator. The sweep will now stop, and the phase-lock loop will pull into lock with one of the sidebands of the I.F. signal.

Lock onto the main line of the I.F. signal is achieved as follows. The I.F. signal from the filter 18 is fed to a frequency discriminator 40, having a center frequency equal to the frequency of the reference oscillator 24. If the loop is locked on to the main line, the spectrum of the I.F. signal will be disposed symmetrically about the center frequency of the discriminator, and the output of the discriminator will therefore be zero. If however the loop is locked on to one of the sidebands, the spectrum will be asymmetrical relative to the center frequency of the discriminator, and the output will be positive or negative depending on whether the sideband locked on to is higher or lower in frequency than the center frequency.

The output from the discriminator is applied to the integrator 26, and therefore acts as a bias signal to cause the frequency of the local oscillator 14 to be swept further, in such a manner as to tend to position the I.F. spectrum symmetrically with respect to the centre frequency of the discriminator, so reducing the output of the discriminator to zero. Thus, it will be seen that the discriminator 40 forms, along with the local oscillator 14, mixer 12, amplifier 16, filter 18 and integrator 26, an automatic-frequency-control loop, which controls the frequency of the local oscillator in such a manner as to tend to sweep the main line of the I.F. spectrum into frequency coincidence with the frequency of the reference oscillator. As the main line approaches the reference oscillator frequency, the phase-lock loop comes strongly into operation, and pulls rapidly into lock with the main line.

Thus, it will be seen that in FIG. 2, the main line is recognised on the basis of its frequency relationship to the sidebands, whereas in FIG. 1, the main line is recognised on the basis of its amplitude relationship to the sidebands.

The system of FIG. 1 can be modified to make it suitable for use with low-duty-ratio signals by incorporating a discriminator connected between the output of the I.F. amplifier and the input of the integrator, as in FIG. 2, and by lowering the threshold level of the threshold circuit 38 such as to cause the circuit 38 to be triggered by a sideband, instead of by the main line. The action of the system is then as follows. First, the frequency of the local oscillator is scanned, under the action of the bias signal, until the circuit 38 is triggered. The sweep bias signal is thus removed, as described, and the phase-lock loop pulls into lock with a sideband. The discriminator then comes into operation, as in the case of FIG. 2, to break the lock and to sweep the frequency of the local oscillator further, until the loop comes into lock with the main line.

Figure 3:
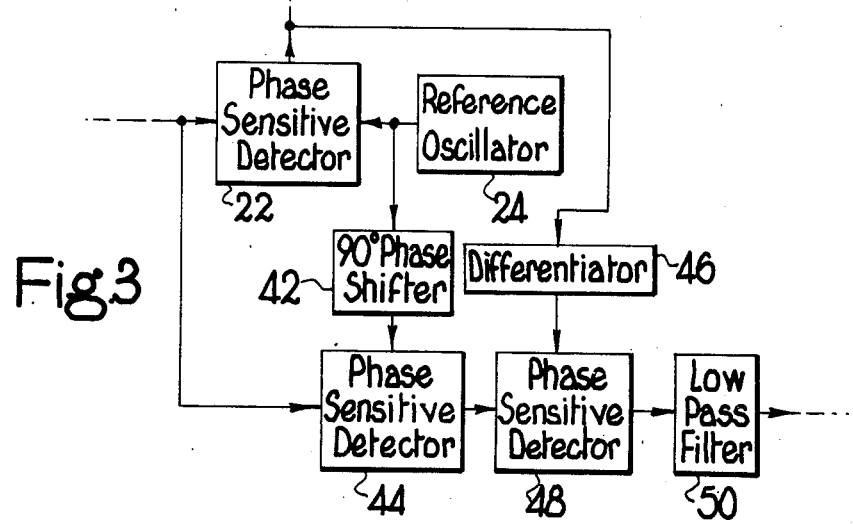
FIG. 3 is a schematic block circuit diagram illustrating a modification of the system of FIG. 2.

Referring now to FIG. 3, in a modification of the circuit of FIG. 2, the discriminator 40 is removed and replaced by the following arrangement. The output from the reference oscillator 24 is phase-shifted by 90° by means of a phase-shifter 42, and is compared in a second phase-sensitive detector 44 with the output from the I.F. filter 18. The output from the first phase-sensitive detector 22 is differentiated in a differentiator circuit 46, and then compared with the output from the second phase-sensitive detector 44, by means of a third phase-sensitive detector 48. Finally, the output of the phase-sensitive detector 48 is filtered by a low-pass filter 50, and is applied to the input of the integrator 26 (FIG. 2) in place of the output of the discriminator 40 in FIG. 2.

The operation of the circuit of FIG. 3 is best appreciated by considering what happens when a single frequency signal is applied to its input from the I.F. filter 18. In this case, the low-frequency outputs from the first and second phase-sensitive detectors 22 and 44 are respectively equal to $V \sin \Delta wt$ and $V \cos \Delta wt$, where $\Delta w$ is the difference between the reference frequency and the input frequency, and V is the maximum D.C. output of the two phase-sensitive detectors. The output from the differentiator 46 is thus equal to:

$$T \cdot \frac{d}{dt} \cdot (V \sin\Delta wt) = T.V.\Delta w. \cos\Delta wt$$

where T is the time constant of the differentiator. Thus, the output from the third phase sensitive detector 48 is equal to:

$$\frac{2}{\pi} T.V.\Delta w$$

i.e. is directly proportional to the frequency difference between the input signal and the reference frequency. Thus, it will be seen that the circuit of FIG. 3 effectively acts as a discriminator having a center frequency equal to that of the reference oscillator, and the system therefore operates in a manner similar to that of FIG. 2.

One advantage of the form of discriminator circuit shown in FIG. 3 is that if the frequency of the reference oscillator is variable, the discriminator center frequency varies with the reference frequency. Thus, the circuit of FIG. 3 effectively provides a variable-center-frequency discriminator.

What we claim is:

1. A phase-lock loop system, for receiving and frequency tracking an incoming oscillatory signal having a plurality of frequency components, comprises: a local oscillator for the generation of a local oscillator signal; mixer means for generating an intermediate frequency (I.F.) signal containing a plurality of I.F. components dependent on the incoming signal and on the local oscillator signal; a reference oscillator; a phase-comparison circuit for performing a comparison between the reference oscillator output and said generated I.F. signal; means for automatically adjusting the frequency of said local oscillator in response to the result of said comparison, in such a manner as to tend to lock the oscillator into a predetermined frequency and phase relationship with one of said frequency components of said incoming signal; and signal acquisition means comprising scanning means for causing said local oscillator to scan through a predetermined range of frequencies so as to momentarily lock on to each of said frequency components in turn, detector means for measuring, as a proportion of the total power of said signal, the intensity of each said frequency component as it is momentarily locked on to; and threshold means for producing an inhibiting signal when the measured intensity of a said frequency component exceeds a predetermined threshold value, said inhibiting signal being applied to said scanning means to prevent further operation thereof and thus to permit the local oscillator to lock with that frequency component.

2. A phase-lock loop system as claimed in claim 1, in which said phase-comparison circuit includes an amplifier having automatic gain control for amplifying the I.F. signal produced by the mixer, and a phase-sensitive detector for measuring the instantaneous phase difference between said reference oscillator output signal and the amplified I.F. signal, and in which said means for automatically adjusting said local oscillator operates so as to tend to reduce the value of said instantaneous phase difference to zero and thus to lock one of the I.F. components to the reference signal frequency, thereby establishing the required frequency and phase relationship between the local oscillator output and one of the components of the incoming signal.

3. A phase lock loop system as claimed in claim 2 in which the signal acquisition means preferably further comprises a frequency discriminator, the input of which is supplied with the signal from said amplifier, and the output of which is applied to said local oscillator so as to form an automatic-frequency-control loop which operates, when said scanning means is inhibited, to further scan the frequency of said local oscillator in such a manner as to tend to reduce the output of said discriminator substantially to zero, and thereby cause the phase-lock loop to lock on to a predetermined one of said frequency components.

4. A phase lock loop system as claimed in claim 1 in which said detector means preferably comprises:
   (a) a phase shifter for producing a quadrature signal 90° out of phase with said reference oscillator output signal, and
   (b) a further phase-sensitive detector for comparing the phases of the quadrature signal and said amplified I.F. signal so that, when said loop is locked to one of said I.F. components, and the average value of said phase-comparison signal is thus substantially zero, the output from said further phase-sensitive detector is substantially a maximum and is representative of the intensity of that I.F. component.

5. A phase lock loop system as claimed in claim 1, in which said means for automatically adjusting said local oscillator comprises an integrator.

6. A phase lock loop system as claimed in claim 1 in which said scanning means comprises a source of d.c. voltage for application to said integrator and including a gate which said inhibiting signal disables so as to disconnect said d.c. voltage source from said integrator.

7. A phase-lock loop system, for receiving and frequency tracking an incoming oscillatory signal having a plurality of frequency components comprises: a local oscillator producing an output signal which is controllable in frequency; a mixer for multiplying together the output of said oscillator and said incoming signal so as to produce an I.F. signal containing a plurality of I.F. components; band-pass filter means through which said I.F. signal is passed; a reference oscillator producing a reference signal output; a phase-sensitive detector for measuring the instantaneous phase difference between said reference signal and the I.F. signal from said filter means; means for automatically adjusting the frequency of said local oscillator in response to said phase difference as measured by said phase-sensitive detector so as to tend to lock one of said I.F. components to the reference signal frequency, and thereby establish a predetermined frequency and phase relationship between the local oscillator frequency and one of the frequency components of the incoming signal; and signal acquisition means comprising: means for causing said local oscillator to scan through a predetermined range of frequencies, so as to tend to bring said I.F. components into the pass-band of said filter; inhibiting means responsive to a rise in the output from said filter, indicating that at least some of said I.F. components have been brought into said pass band, to inhibit said scanning means so as to prevent further operation thereof; and a frequency discriminator the input of which is supplied with the I.F. signal from said filter and the output of which is used to control the frequency of said local oscillator so as to form an automatic-frequency-control loop which operates, when said scanning means is inhibited, to further scan the frequency of said local oscillator in such a manner as to tend to reduce the output of said discriminator substantially to zero and thereby cause the phase-lock loop to lock on to a predetermined one of said frequency components.

8. A phase-lock loop system, for receiving and frequency tracking an incoming oscillatory signal having a plurality of frequency components comprises: a local oscillator producing an output signal which is controllable in frequency; a mixer for multiplying together the output of said oscillator and said incoming signal so as to produce an I.F. signal containing a plurality of I.F. components; band-pass filter means through which said I.F. signal is passed; a reference oscillator producing a reference signal output; a phase-sensitive detector for measuring the instantaneous phase difference between said reference signal and the I.F. signal from said filter means; means for automatically adjusting the frequency of said local oscillator in response to said phase difference as measured by said phase-sensitive detector so as to tend to lock one of said I.F. components to the reference signal frequency, and thereby establish a predetermined frequency and phase relationship between the local oscillator frequency and one of the frequency components of the incoming signal; and signal acquisition means comprising: means for causing said local oscillator to scan through a predetermined range of frequencies, so as to tend to bring said I.F. components into the pass-band of said filter; inhibiting means responsive to a rise in the output from said filter, indicating that at least some of said I.F. components have been brought into said pass band, to inhibit said scanning means so as to prevent further operation thereof; and frequency discriminating means including a $\pi/2$ phase shifting network connected to the output of said reference oscillator the output of which is connected to a further phase-sensitive detector in which it is compared with the I.F. signal, the output from the further phase-sensitive detector being compared with the differentiated output of the phase-sensitive detector in a yet further phase-sensitive detector, the output of said yet further phase-sensitive detector being the output of said frequency discriminating means, said frequency discriminating means operating to further scan the frequency of said local oscillator in such a manner as to substantially reduce the output of said frequency discriminating means to zero and thereby cause the phase lock loop to lock on to a predetermined one of said frequency components.

* * * * *